United States Patent [19]

Nishizawa

[11] 4,296,425
[45] Oct. 20, 1981

[54] LUMINESCENT DIODE HAVING MULTIPLE HETERO JUNCTIONS

[75] Inventor: Jun-ichi Nishizawa, Sendai, Japan

[73] Assignee: Handotai Kenkyu Shinkokai, Sendai, Japan

[21] Appl. No.: 76,675

[22] Filed: Sep. 18, 1979

Related U.S. Application Data

[63] Continuation of Ser. No. 867,158, Jan. 5, 1978, abandoned, which is a continuation-in-part of Ser. No. 761,468, Jan. 21, 1977, abandoned, which is a continuation of Ser. No. 543,617, Jan. 24, 1975, abandoned, which is a continuation-in-part of Ser. No. 314,393, Dec. 12, 1972, abandoned.

[30] Foreign Application Priority Data

Dec. 14, 1971 [JP] Japan ................. 46-100623

[51] Int. Cl.³ ............... H01L 33/00; H01L 29/203; H01L 29/205
[52] U.S. Cl. ........................ 357/17; 357/16; 357/38; 357/68; 148/171
[58] Field of Search ............... 357/16, 17, 18

[56] References Cited

U.S. PATENT DOCUMENTS

| | | | |
|---|---|---|---|
| 3,677,863 | 7/1972 | Lorenz | 357/17 |
| 3,752,713 | 8/1973 | Sakuta et al. | 357/16 |
| 3,798,083 | 3/1974 | Schmidt | 357/17 |
| 3,806,777 | 4/1974 | Edmonds | 357/17 |
| 3,812,516 | 5/1974 | Hayashi et al. | 357/16 |

*Primary Examiner*—William D. Larkins
*Attorney, Agent, or Firm*—Cushman, Darby & Cushman

[57] ABSTRACT

A luminescent diode comprises a p+type substrate, at least one electron-hole recombination unit consisting of a p-type layer of a certain band gap and an n-type layer of a wider band gap epitaxially grown on said p-type layer to form a hetero junction at the interface therebetween, and a low resistivity contact disposed on an outermost surface of said unit opposite to said substrate. In the unit, said p-type layer is positioned closer to said substrate than said n-type layer. Light emitted in the vicinity of the hetero junction in the p-type layer of the unit is transmitted through this hetero junction and the n-type layer to emit from the outermost surface of the unit.

14 Claims, 12 Drawing Figures

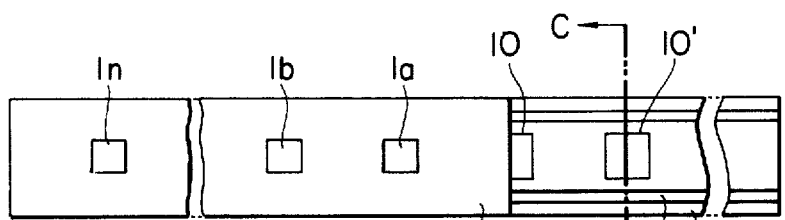
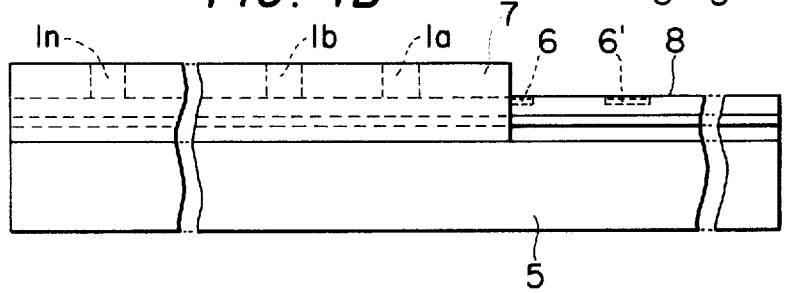
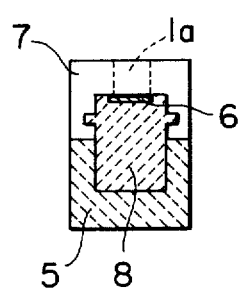
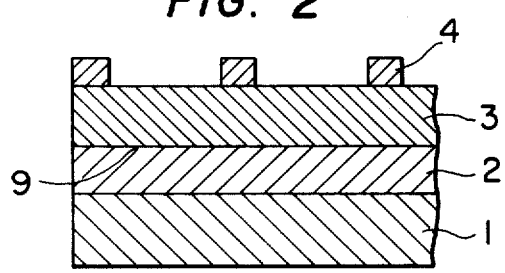
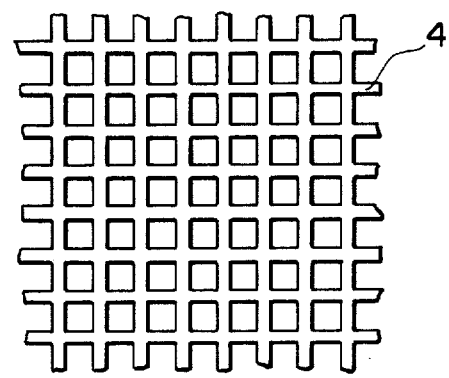
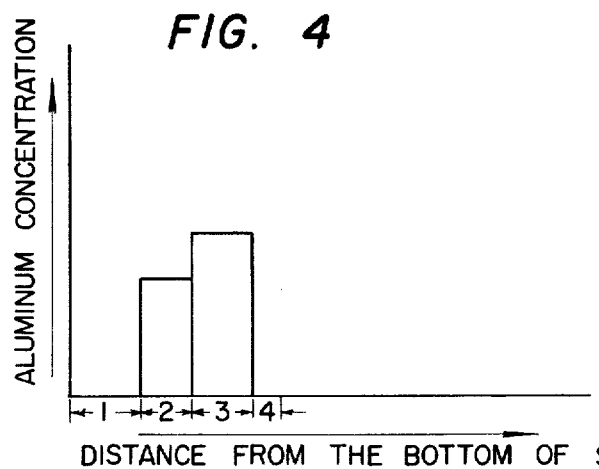

DISTANCE FROM THE BOTTOM OF THE SUBSTRATE

DISTANCE FROM THE BOTTOM OF THE SUBSTRATE

DISTANCE FROM THE BOTTOM OF THE SUBSTRATE

LUMINESCENT DIODE HAVING MULTIPLE HETERO JUNCTIONS

CROSS REFERENCE TO RELATED APPLICATION

This is a continuation of my copending application Ser. No. 867,158 filed Jan. 5, 1978, abandoned upon the filing hereof, which was a Continuation-In-Part of my application Ser. No. 761,468 filed on Jan. 21, 1977, now abandoned which was a Rule 60 Continuation of my great grandparent application Ser. No. 543,617 filed on Jan. 24, 1975 (now abandoned) which was a Continuation-In-Part of my great great-grandparent application Ser. No. 314,393 filed on Dec. 12, 1972 (now abandoned).

BACKGROUND OF THE INVENTION (a) Field of the invention:

The present invention relates to luminescent (light-emitting) diodes and more particularly it pertains to those luminescent diodes having at least one p-n hetero junction and a p-type substrate.

(b) Description of the prior art:

Some attempts have been made heretofore for the production of luminescent (light-emitting) diodes. For example, in U.S. Pat. No. 3,677,836 issued to M. R. Lorenz, there is disclosed a luminescent diode having a homo junction at which a p-region and an n-region have the same forbidden bandwidth, the forbidden bandwidths of the p-region and the n-region increasing with the distance from the junction. In this structure, the absorption of light emitted near the p-n homo junction is not avoidable. Though Lorenz further refers to a hetero junction formed in either the n-region or the p-region, he teaches that the hetero junction reflects backwardly the light emitted at a recombination region to take the light out again through the recombination region at the surface located remote from the hetero junction. U.S. Pat. No. 3,812,516 issued to Hayashi discloses an electroluminescent diode having both homo- and hetero-junctions and an n-type substrate. The hetero junction acts to give a carrier confinement effect and therefore a p-type region on that side of the hetero junction opposite to the homo junction has the widest band gap among those regions located in the vicinity of the junctions. This type of diode is still unsatisfactory in light-emitting performance. Hayashi does not disclose any working example with a double hetero (DH) junction and no homo junction, though Hayashi refers to a possibility of existence of such type of diode.

SUMMARY OF THE INVENTION

An object of the present invention is to provide a luminescent (light-emitting) diode which is free from the aforementioned disadvantages and has a p-n hetero junction to enable highly efficient light-emission with minimum absorption of light transmitted in the direction perpendicular to the p-n junction plane.

According to the present invention, there is provide a luminescent diode comprising a p+ type substrate, at least one electron-hole recombination unit consisting of a p-type layer of a certain band gap and an n-type layer of a band gap wider than said certain band gap and epitaxially grown on said p-type layer to form a hetero junction at the interface between said p-type layer and said n-type layer, and a low resistivity contact disposed on an outermost surface of said unit opposite to said substrate. The p-type layer of the unit is disposed closer to the substrate than is the n-type layer. Light emitted in the vicinity of the hetero junction in the p-type layer of the unit is transmitted through the hetero junction and taken out at the outermost surface of the unit opposite to the substrate.

BRIEF DESCRIPTION OF THE INVENTION

The principle and construction of the present invention will be clearly understood from the following detailed description with reference to the accompanying drawings, in which:

FIG. 1A is a plan view of an apparatus producing luminescent diodes of the present invention;

FIG. 1B is a side view of the apparatus of FIG. 1A;

FIG. 1C is a cross sectional view taken along the line C—C in FIG. 1A;

FIG. 2 is a diagrammatic cross sectional view of an embodiment of the diode of the present invention;

FIG. 3 is a diagrammatic plan view of an example of a contact used in the present invention;

FIG. 4 is a sketch showing a band gap of each epitaxial layer and the substrate of an embodiment of a diode of the present invention as a function of the distance from the bottom of the substrate in the direction of the thickness;

DETAILED DESCRIPTION OF THE PREFERRED EMBODIMENTS

Figure 5A:
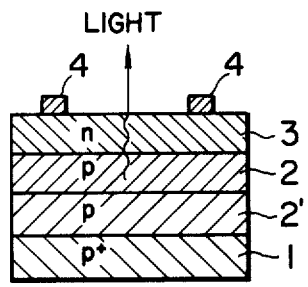
FIGS. 5A, 6A and 7A are diagrammatic cross sectional views each illustrating an example of the luminescent diode of the present invention.

With reference to FIGS. 1A, 1B and 1C, an apparatus for producing a luminescent diode of the present invention comprises a boat 5, a carbon jig 7 and a slider 8. For example, the boat 5 is made of carbon and has a length of 15 cm, a height of 1.5 cm and a width of 2 cm. The carbon jig 7 has a plurality of holes $1a, 1b, \ldots, 1n$ which are arranged at regular intervals and have, for example, a cubic form of 0.6 cm in length, in width and in depth. The slider 8 has a GaAs substrate 6, 6' fixedly accommodated in each of two recesses 10, 10' and has, for example, dimensions of 15 cm in length, of 1.5 cm in height and of 1.5 cm in width. The slider 8 is movably mounted on the boat 5 along the longitudinal central axis thereof. The slider 8 is slidably engaged with the carbon jig 7 and the boat 5.

In operation, at first the substrate 6 is placed under the hole $1a$, and an epitaxial layer of a desired thickness is deposited on the substrate. Then, slider 8 is pushed at the right end thereof to replace the substrate 6 located under the hole $1b$, and also at the same time the substrate 6' located under the hole $1a$. Then, another epitaxial layer is deposited on the previously deposited epitaxial layer on the substrate 6, and at the same time a first epitaxial layer is deposited on substrate 6'. In this way, a desired number of epitaxial layers are deposited on each substrate.

By the use of the above apparatus shown in FIGS. 1A, 1B and 1C, a luminescent diode having a multilayer structure as shown in FIG. 2 is obtained. In this example, a p-type $Ga_{1-x}Al_xAs$ layer 2 having an aluminum concentration x is grown on a p+ type GaAs substrate 1 of a lower resistance at a temperature of about 1000° to 950° C. Since the luminescent diode is usually required to emit rays within a visible wavelength range of the electromagnetic spectrum at a high brightness for human eyes, it is desirable that the composition of the luminescent p-layer satisfy the relation of $0.2 \leq x \leq 0.35$. If x is higher than 0.35, the luminescent mechanism is transferred from direct-transition to indirect-transition, so that the luminescent efficiency is abruptly reduced. On the other hand, when x is lower than 0.2, the wavelength of the light to be emitted is too long to be visible for human eyes, and therefore, x should not be lower than 0.2 for a visible luminescent diode. However, x may be lower than 0.2 when luminescent diodes capable of emitting invisible rays for human eyes are required. An n-type $Ga_{1-y}Al_yAs$ layer 3 having an aluminum concentration y of higher than that x is next grown at a temperature of about 950° to 850° C.

The luminescent light is substantially generated from the p-layer and taken out across the n-layer in the direction perpendicular to the junction plane. In this case, if the composition y is equal to or less than the composition x, the forbidden bandwidth of the n-type layer 3 becomes narrower than that of the p-type layer 2 so that light generated from the p-type layer is greatly absorbed in the n-type layer. However, if the composition y is larger than the composition x as used in the present invention, the forbidden bandwidth of the n-type layer becomes larger than that of the p-type layer so that light is hardly absorbed in the n-type layer. Since the n-type layer is not a luminescent layer, the composition of this n-type layer is not necessary to satisfy the relation of $y < 0.35$. The absorption coefficient near the indirect absorption edge is smaller, by not less than $10^2$ than that of the direct absorption edge. Therefore, the relation of $y > 0.35$ should desirably be satisfied. Since epitaxial growth becomes difficult if the composition y is too large, a relation of $y \leq 0.65$ should desirably be satisfied. A thin n+ type GaAs layer 4 of a lower resistance is grown at a lower temperature of about 850° to 830° C. By forming the layer 4 in this way, power loss due to contact resistances can be effectively reduced.

The above mentioned GaAs layer 4 may be selectively etched in the form of a checkered plate as shown in FIG. 3, so that the output light can be taken out in the vertical direction to the plane of the junction.

In order to realize each epitaxial growth with the intended composition x or y, the quantities of Ga, GaAs and Al to be charged in the holes 1a, 1b, ..., 1n can be determined to give liquid phase compositions capable of depositing the desired epitaxial layers with reference to the known ternary Ga-Al-As phase diagram. In a preferred embodiment, ten grams of Ga, two to three grams of GaAs and 0.019 grams of Al are charged in the hole 1a to obtain a composition x=0.3, while ten grams of Ga, 1.2 grams of GaAs and 0.028 grams of Al are charged in the hole 1b to obtain a composition y=0.45.

The liquid growth is performed by the following steps. At first, the temperature of the boat 5 is raised up to about 1010° C. in a hydrogen atmosphere after the above materials are charged in the holes 1a and 2a, and the temperature of about 1010° C. is maintained for half an hour to one hour to obtian a sufficient solution. Thereafter, the temperature of the boat 5 is lowered to a temperature suitable to allow the growth of the first epitaxial layer, and then the substrate 6 is slided with the slider 8 to be placed just under the hole 1a.

Figure 5B:
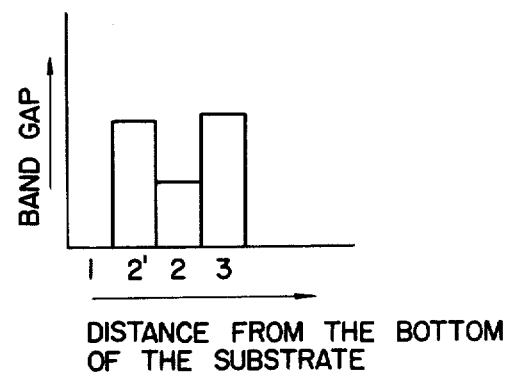
FIGS. 5B, 6B and 7B are illustrations similar to FIG. 4 showing variations of band gap of the diodes shown in FIGS. 5A, 6A and 7A, respectively.

The present invention is not limited specifically to the luminescent diode having the four layer construction described above, but it is applicable equally to other multilayer constructions also. At least one $Ga_{1-x'}Al_{x'}As$ layer 2' having an aluminum concentration x' higher than that of the layer 2 may be provided between the layer 2 and the substrate 1, as shown in FIGS. 5A and 5B. In this luminescent diode, a p-p hetero junction is formed by the p-type layers 2 and 2', and a p-n hetero junction is formed by the p-type layer 2' and the n-type layer 3. Light is emitted in the layer 2, and is taken out at the outer surface of layer 3 in the direction perpendicular to the junction plane. As another embodiment of the present invention, at least one $Ga_{1-x''}Al_{x''}As$ layer having an aluminum concentration x'' higher than that of the layer 3 may be provided between the layers 3 and 4. Each of the above intermediate layers may be an intrinsic layer. Three $Ga_{1-x}Al_xAs$ layers, the central layer of which is of a different conductivity type to those of other layers, may be formed so as to have a higher impurity concentration than that of the central layer alone.

FIG. 4 is a diagrammatical graph showing an aluminum concentration as a function of a displacement in the direction across the thickness of the grown layers as measured by an electron microprobe analysis. In FIG. 4, the ordinate represents the aluminum concentration, while the abscissa represents a distance from the bottom of substrate 1 in the direction across the thickness of the epitaxial layers. Injected carriers can be confined in a narrow area in the vicinity of the junction formed between the $Ga_{1-x}Al_xAs$ layer 2 and the $Ga_{1-y}Al_yAs$ layer 3 at a portion indicated by reference numeral 9 where the aluminum concentration is at a stepwisely decreased level and where recombination occurs to generate electromagnetic rays. Moreover, absorption of light directed in the vertical direction relative to the junction plane may be decreased by increasing the impurity concentration y of the layer 3. It should be appreciated from the use of such an apparatus as shown in FIGS. 1A to 1C that the aluminum concentration changes stepwisely as shown in FIG. 4.

The luminescent diode of the above construction exhibits a high luminescent efficiency and a high brightness such as an external quantum efficiency of 0.4%, and a brightness of 2300 ft.L (at a current density of 8A/square cm) and 9000 ft.L (at a current density of 40A/square cm) at a wavelength of 6600 A.

The luminescent diode of the present invention is not limited specifically to the case of $Ga_{1-x}Al_xAs$ which has been described above. It is possible with III–V compounds or II–VI compounds including or excluding aluminum that the forbidden bandwidth of the luminescent region provided at the p-type layer side of the junction is smaller than the forbidden bandwidth provided at the n-type layer side, so that the luminescent light produced at one side of the junction passes through the junction and at least one layer without substantial absorption to be taken out from the surface of the layer. For example, a p-type $In_{1-x}Ga_xP$ layer having a narrower forbidden bandwidth and including recombination region can be epitaxially grown on an n-type GaP substrate to take out the luminescent light through the GaP substrate. Other compounds which may be used in the present invention include III-V compounds (e.g. GaP-InGaP, GaN-GaP, GaAsP-GaAs, GaP-GaAsP, GaP-GaPN), and II-VI compounds (e.g. ZnTe-ZnCdTe, ZnSe-CdS, CdSe-CdTe, CdS-CdSe). Moreover, combinations of crystals of the III–V compounds and crystals of the II–VI compounds may be also employed with crystals which have composition ratio y larger or smaller than that of the compounds.

Figure 6A:
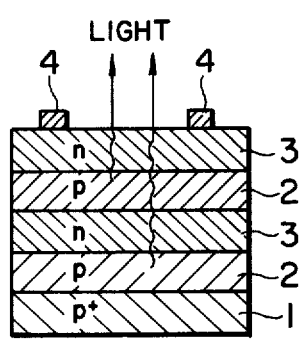
Figure 6B:
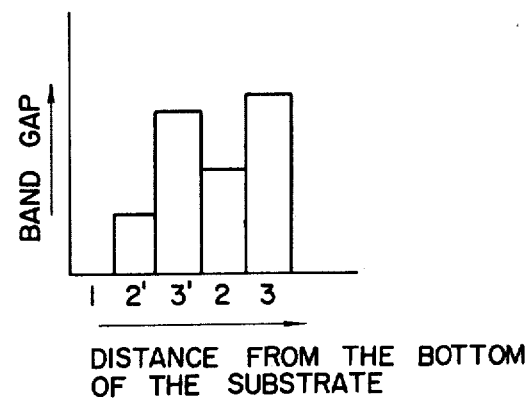

As still another embodiment of the present invention, there is provided a luminescent diode as shown in FIGS. 6A and 6B, in which two p-n hetero junctions are contained. Each of the hetero junctions is of the same type as that shown in FIG. 2. The energy gaps of the light emission layers 2 and 2' can be selected so that they emit lights of different wavelengths, so that two kinds of radiation can be obtained. For instance, if the GaAlAs composition is employed and if the aluminum concentration of the first light emission layer 2 and the second light emission layer 2' are selected to be 0.3 and 0.1, respectively, red and infrared wavelengths can be obtained at the same time. By selecting the wavelength of the light from the second light emission layer 2' to be longer than that from the first light emission layer 2, the absorption of the light from the second light emission layer 2' is avoidable. In this case, since the p-n junction of the reverse direction exists, the S-shaped negative resistance appears. It is possible, of course, to control the radiation intensity and wavelengths by connecting a control electrode to an intermediate layer as is the case with an ordinary negative resistance device.

Figure 7A:
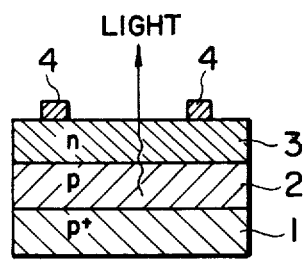
Figure 7B:
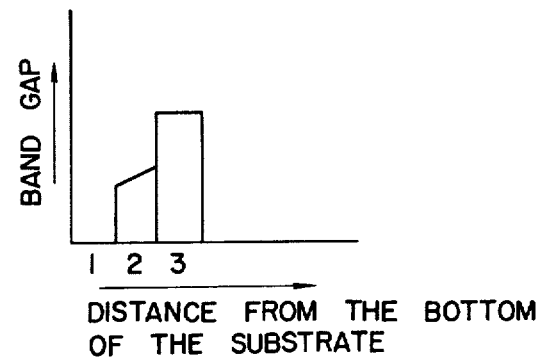

In the present invention, the band gap in an epitaxial layer is not necessarily the same through the thickness thereof. Thereof, as still another embodiment of the present invention, there is provided a luminescent diode as shown in FIGS. 7A and 7B, in which the band gap of the light emission layer increases with the distance from the substrate. Even in such a case, the p-n hetero junction which performs the carrier injecting function is required and formed at the interface between the layers 1 and 3. With such a slope, there is no possibility that a defect is produced by a boundary plane, such as a p-p hetero junction, to decrease the radiation efficiency, and light can travel with minimum absorption in the light emission layer 2.

In the above examples, the thickness of the light-emission layer may be selected by taking account of liftime, and the diffusion length of carriers so that a maximum luminescent efficiency is obtained. For example, it may be about 1 micrometer or more, e.g. three micrometers.

What is claimed is:

1. A luminescent diode comprising:
A p+ type substrate;
at least one unit consisting of a p-type layer of a certain band gap and an n-type layer of a band gap wider than said certain band gap and epitaxially grown on said p-type layer to form a heterojunction at the interface between said p-type layer and said n-type layer, said unit being disposed in such a way that said p-type layer is located closer to said substrate than is said n-type layer, the band gap of said p-type layer increasing gradually with distance from said substrate;
said substrate being capable of absorbing light entering there into from said p-type layer; and
a low resistivity contact disposed on an outermost surface of said unit opposite to said substrate, said contact having an area contacting said outermost surface smaller than the area of said outermost surface for allowing a light output to be taken at said outermost surface.

2. A luminescent diode comprising:
A p+ type substrate;
at least one unit consisting of a p-type layer of a certain band gap and an n-type layer of a band gap wider than said certain band gap and epitaxially grown on said p-type layer to form a heterojunction at the interface between said p-type layer and said n-type layer, said unit being disposed in such a way that said p-type layer is located closer to said substrate than is said n-type layer, the and gap of said p-type layer increasing monotonically with distance from said substrate;
said substrate being capable of absorbing light entering there into from said p-type layer; and
a low resistivity contact disposed on an outermost surface of said unit opposite to said substrate, said contact having an area contacting said outermost surface smaller than the area of said outermost surface for allowing a light output to be taken at said outermost surface.

3. A luminous diode comprising:
a P+ type substrate having a first constant band gap;
a P type layer disposed on said substrate having a second constant band gap wider than said first band gap;
an N type layer disposed on the P type layer having a third band gap wider than said second band gap; and
a low resistivity contact disposed on an outermost surface of said diode opposite to said substrate, said contact having an area contacting said outermost surface smaller than the area of said outermost surface for allowing a light output to be taken at said outermost surface.

4. A luminescent diode comprising:
a p+ type substrate;
at least one unit consisting of a p- type layer of a certain band gap and a n-type layer of a band gap wider than said certain band gap and epitaxially grown on said p-type layer to form a hetrojunction at the interface between said p-type layer and said n-type layer, said unit being disposed in such a way that said p-type layer is located closer to said substrate than is said n- type later, the band gap of said unit increasing monotonically with distance from said substrate;
said substrate being capable of absorbing light entering there into from said p- type layer; and
a low resistivity contact disposed on an outermost surface of said unit opposite to said substrate, said contact having an area contacting said outermost surface smaller than the area of said outermost surface for allowing a light output to be taken at said outermost surface.

5. A luminous diode comprising:
a semiconductor body having first and second opposing principle surfaces include a P+ type substrate adjacent to said first principle surface, a P type layer formed on said substrate and an N type layer formed on said P type layer adjacent to said second principle surface and forming a hetrojunction with said P type layer, the band gap in said semiconductor body increasing monotonically from said first principle to said second principle surface, and
a low resistivity contact disposed on said second principle surface, said contact having an area contacting said second principle surface smaller than the area of said principle surface thereby allowing a light output to be taken at said second principle surface.

6. A luminescent diode according to claim 1, 2 or 4, wherein: said unit is epitaxially grown on said substrate.

7. A luminescent diode according to claim 1, 2 or 4, wherein: said contact is of an n+ type semiconductor and epitaxially grown on said outermost surface of said unit.

8. A luminescent diode according to claim 1, 2, 3, 4 or 5, wherein: said substrate is made of GaAs, said p-type layer is made of $Ga_{1-x}Al_xAs$ and said n-type layer is made of $Ga_{1-y}Al_yAs$, wherein $y>x$.

9. A luminescent diode according to claim 8, wherein: x is a positive number less than 0.35 and $0.35<y\leqq0.65$.

10. A luminescent diode according to claim 3, wherein said contact is of a mesh structure.

11. A luminescent diode according to claims 3 or 5 wherein said P type layer is epitaxially grown on said substrate.

12. A luminescent diode according to claim 5 wherein said contact is of an N+ type semiconductor and epitaxially grown on said second principle surface.

13. A luminscent diode according to claim 9 wherein $0.2<x\leqq0.35$.

14. The luminescent diode of claim 11 wherein said contact is of a mesh structure.

* * * * *